US008263029B2

(12) United States Patent
Jakli et al.

(10) Patent No.: US 8,263,029 B2
(45) Date of Patent: Sep. 11, 2012

(54) METHOD FOR PREPARING ANISOTROPIC PARTICLES AND DEVICES THEREOF

(75) Inventors: Antal Jakli, Kent, OH (US); Stefanie Taushanoff, Kent, OH (US); Mátyás Molnár, Torbágy (HU); Attila Bóta, Nánási (HU); Erika Kalman, Csákó (HU); Peter Palinkás, legal representative, Budapest (HU); Andrea Palinkás, legal representative, Budapest (HU); Zoltan Varga, Lövöház (HU)

(73) Assignee: Kent State University, Kent, OH (US)

( * ) Notice: Subject to any disclaimer, the term of this patent is extended or adjusted under 35 U.S.C. 154(b) by 17 days.

(21) Appl. No.: 12/546,986

(22) Filed: Aug. 25, 2009
(Under 37 CFR 1.47)

(65) Prior Publication Data
US 2010/0158790 A1 Jun. 24, 2010

Related U.S. Application Data

(60) Provisional application No. 61/190,013, filed on Aug. 25, 2008.

(51) Int. Cl.
*C01G 17/00* (2006.01)
*C01G 9/00* (2006.01)
*C01G 19/08* (2006.01)
*C01G 17/02* (2006.01)

(52) U.S. Cl. ....... 423/99; 423/89; 423/494; 423/594.18; 423/618

(58) Field of Classification Search ............... None
See application file for complete search history.

(56) References Cited

U.S. PATENT DOCUMENTS

| 4,022,701 | A | * | 5/1977 | Sawa et al. | 252/62.54 |
| 5,393,451 | A | * | 2/1995 | Koetzle | 510/365 |
| 6,106,976 | A | * | 8/2000 | Ozaki et al. | 429/218.1 |
| 6,583,284 | B1 | * | 6/2003 | Sidorenko et al. | 544/342 |
| 6,962,734 | B2 | * | 11/2005 | Nazarov et al. | 428/1.31 |
| 2002/0001613 | A1 | * | 1/2002 | Niemiec et al. | 424/450 |
| 2006/0063882 | A1 | * | 3/2006 | Velev et al. | 524/543 |
| 2006/0204750 | A1 | * | 9/2006 | Miyoshi et al. | 428/364 |
| 2007/0054104 | A1 | * | 3/2007 | Ittel et al. | 428/292.1 |
| 2008/0094326 | A1 | * | 4/2008 | Yamaki et al. | 345/87 |
| 2009/0170212 | A1 | * | 7/2009 | Van Der Wijk et al. | 436/149 |
| 2009/0201583 | A1 | * | 8/2009 | Kamada et al. | 359/486 |
| 2009/0221734 | A1 | * | 9/2009 | Kuwahara et al. | 524/404 |

FOREIGN PATENT DOCUMENTS
WO 2006068331 * 6/2006
WO 2007145022 * 12/2007

OTHER PUBLICATIONS

Zhang, Jianling "Ultrasonication-Induced Formation of Silver Nanofilbers in Reverse Micelles and Small Angle X Ray Scattering Studies". J Pys. Chem. B 2003, 107, 3679-3683.*
Hayter, John et al. "Use of Viscous Shear Alignment to Study anistropic micellar structure by small angle neutron scattering" J Phys. Chem. 1984, 88, 4589-4593.*
Alargova, Rossita, et al. "Scalable Synthesis of a New Class of Polymer Microrods by a liquid-liquid Dispersion Technique". Ad Mater. 16, No. 18, 1653 (2004).*
Kim, C.U. et al. "Emulsion Polymerization of tetrafluoroethylene: effects of reaction conditions on particle formation" Journal of Fluorine Chemistry 11-21, 96 (1999).*

* cited by examiner

*Primary Examiner* — Melvin C Mayes
*Assistant Examiner* — Sheng H Davis
(74) *Attorney, Agent, or Firm* — Fay Sharpe LLP

(57) ABSTRACT

The invention provides a simple and cost-effective method for preparing particles such as anisotropic semiconductor nanoparticles (e.g. CdS) and devices thereof. The method comprises (i) dispersing at least part of particle-forming reactants in a self-organized medium such as surfactant-aqueous solution system, and (ii) conducting a particle-forming reaction using the particle-forming reactants dispersed in the self-organized medium under shear condition to form the particles. The anisotropic property of the particles is controlled at least partially by the shear condition. The invention may be used to prepare quantum dots in a liquid crystal, and various devices such as nonlinear optics, optoelectronic devices, and solar cells, among others.

21 Claims, 9 Drawing Sheets

(1a)

(1b)

(1c)

METHOD FOR PREPARING ANISOTROPIC PARTICLES AND DEVICES THEREOF

This application claims priority based on the U.S. Provisional Application 61/190,013 filed on Aug. 25, 2008, which is incorporated herein by reference in its entirety.

This invention was made with the United States Government support under Grant No. NSF OISE-0727185 from the National Science Foundation, Office of International Science and Engineering. The United States Government has certain rights in this invention.

BACKGROUND OF THE INVENTION

The present invention is related to a method of preparing particles such as nanoparticles having a controllable anisotropic property and devices including such particles. The invention finds particular application in conjunction with anisotropic nanoparticles such as quantum dots in liquid crystals, nonlinear optics, optoelectronic devices, solar cells, photocatalysis devices, photodegradation devices, nanolasers, computing devices, photoluminescence (PL) devices, electroluminescence (EL) devices, $H_2$ generators, liquid crystal displays, one-dimensional semiconductor nanostructures, chromogenic smart devices, optical switches, filters, integrated photonic devices, power conserving LCD devices, power-consuming reflective displays, backlit displays, cell phone displays, intensity-controlled switchable windows, traffic lights using reflective liquid crystal panels, and spatial light modulators, and will be described with particular reference thereto. However, it is to be appreciated that the present exemplary embodiments are also amenable to other like applications.

Among different nanometer-scale particles, the preparation and the characterization of semiconductor particles represents an important field due to their potential utilization in nonlinear optics, optoelectronic devices, solar cells, in photocatalysis and in photodegradation (used in environmental protection technologies). Several methods have been used to synthesize suitable particles in situ based on systems such as reverse micelles, Langmuir-Blodget films, clay minerals, multi-walled carbon nanotubes, microemulsions, polyelectrolyte/surfactant complexes, ordered polypeptide or other organic matrices, hydrated derivates of polysaccharides prepared from bacteria, and uni- and multilamellar vesicles as reaction mediums.

Due to its optimum characteristics, CdS is the most often studied and described among many semiconductor nanoparticles. Unilamellar vesicles (liposomes) consisting of natural or artificial amphiphilics are ideal systems for the synthesis of CdS nanoparticles, because the versatility of the bilayers provides many possibilities for both particle size and shape modification, as disclosed in Y.-M. Tricot, J. H. Fendler, J. Phys. Chem. 90, 3369 (1986), B. A. Korgel, H. G. Monbouquette, Langmuir 16, 3588 (2000). The aqueous cores of the vesicles, because they behave as nearly spherical nanoreactors, provide a place for a chemical reaction resulting in solid nanoparticles. Recently, A. Bóta et al. have pointed out that the aqueous holes between the stacks of bilayers inside multilamellar vesicles are also adequate reaction compartments for the preparation of CdS nanoparticles. A. Bóta, Z. Varga and G. Goerigk: Biological systems as nanoreactors: anomalous small-angle scattering study of the CdS nanoparticles formation in multilamellar vesicles, Journal of Physical Chemistry B, 111 (2007) 1911-1915.

Divalent metal ions such as $Cd^{2+}$ cause significant destruction in layer arrangement of these vesicles and at the same time the formation of domains rich in $Cd^{2+}$ ions can be observed. These domains, with a characteristic size in the range of several hundred Å, are embedded inhomogeneously between the bilayers of vesicles. By adding an adequate reagent such as $(NH_4)_2S$ to the system, the multilamellar structure is reconstructed significantly. As the collapse of gaps filled with $Cd^{2+}$ ions occurs, compact small (CdS) particles are formed. The characteristic size of these particles falls into the range of approximately 5-10 nm. This procedure contains two critical points: first, the water-soluble metal ions form domains having a critical maximal size and an adequate metal concentration, which strongly determine the size of the resulting nanoparticles. Secondly, each domain results in the formation of one nanoparticle after the addition of reagent. The schematic procedure of making nanoparticles in lyotropic liquid crystals is shown in FIGS. 1a, 1b and 1c. FIG. 1a shows a lipid-water (l-w) system with bilayers of vesicles (the curved lines). FIG. 1b shows an l-w system with domains (dotted egg) rich in metal ions. FIG. 1c shows an l-w system with nanoparticles formed (solid oval).

Many other methods have also been used to prepare CdS nanorods and nanowires, such as a vapor-liquid-solid process, a thermal evaporation method, a template method, and an aqueous-solution process. In the past years, the hydrothermal method has been expanded to synthesize 1D nanostructures by solvothermal and hydrothermal microemulsion methods. Recently, it was shown that lyotropic columnar liquid crystalline materials can also act as a growth medium to optimize the size and shape of the semiconducting nanorods. The fabrication of CdS nanorods in PVP fiber matrices by electrospinning has also been reported. However, there remains a need to further simplify the methods and reduce the costs for synthesis of particles such as semiconducting nanoparticles.

Advantageously, the present invention provides a method for preparing anisotropic particles, such as semiconductor nanoparticles, and further provides various industrial applications of such anisotropic particles, exhibiting numerous technical merits such as a simplified and more controllable procedure, and cost-effectiveness, among others.

BRIEF DESCRIPTION OF THE INVENTION

One aspect of the invention provides a method of preparing particles having a controllable anisotropic property. The methods comprises the steps of:
(i) providing particle-forming reactants;
(ii) dispersing at least part of the particle-forming reactants in a self-organized medium, and
(iii) conducting a particle-forming reaction using the particle-forming reactants dispersed in the self-organized medium under shear condition to form the particles,
wherein said anisotropic property of the particles is controlled at least partially by the shear condition.

Another aspect of the invention provides a method of preparing a device including the step of using particles having a controllable anisotropic property, wherein the particles are prepared from a process comprising:
(i) providing particle-forming reactants;
(ii) dispersing at least part of the particle-forming reactants in a self-organized medium, and
(iii) conducting a particle-forming reaction using the particle-forming reactants dispersed in the self-organized medium under shear condition to form the particles, wherein said anisotropic property of the particles is controlled at least partially by the shear condition.

DETAILED DESCRIPTION OF THE INVENTION

Figure 1A:
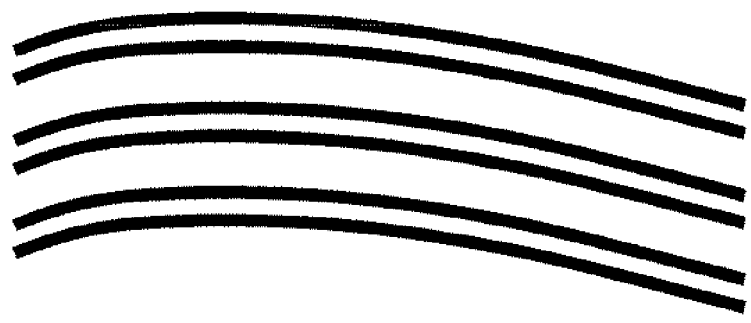
FIG. 1a shows a self-organized medium such as a lipid-water (l-w) system with bilayers of vesicles (the curved lines) in a procedure for making nanoparticles in lyotropic liquid crystals.
Figure 1B:
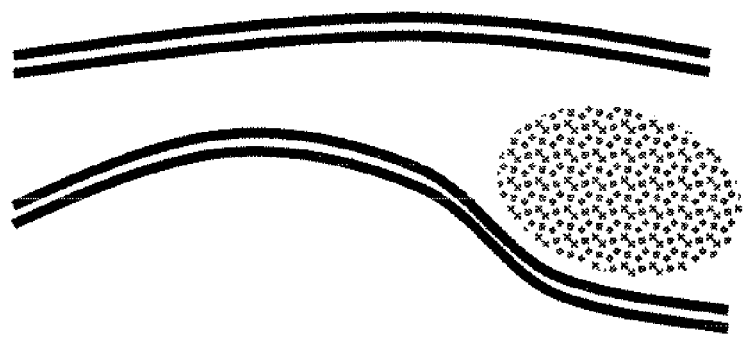
FIG. 1b shows an l-w system with domains (dotted egg) rich in particle-forming reactants, such as metal ions, in a procedure for making nanoparticles in lyotropic liquid crystals.
Figure 1C:
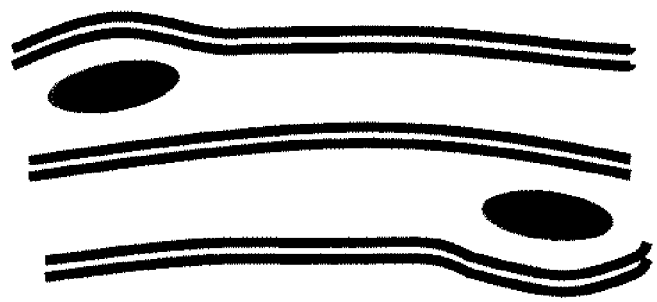
FIG. 1c shows an l-w system with nanoparticles formed (solid oval) in a procedure for making nanoparticles in lyotropic liquid crystals.

Any particular theory that is used in the description, as an attempt to academically understand the mechanism of the invention, should not be interpreted as limitative of the scope of the invention.

The invention is related to a method of preparing particles having a controllable anisotropic property, which comprises (i) dispersing at least part of the particle-forming reactants in a self-organized medium, and (ii) conducting a particle-forming reaction using the particle-forming reactants dispersed in the self-organized medium under shear condition to form the particles; wherein said anisotropic property of the particles is controlled at least partially by the shear condition. The term "at least partially" means that one or more factors other than the shear condition may have an influence on the anisotropic property of the particles, for example, the nature of the particle-forming reactants, the nature of the self-organized medium, and conditions for the particle-forming reaction such as temperature, among others.

In various embodiments of the invention, the self-organized medium comprises reaction compartments for the particle-forming reaction. For example, the self-organized medium may comprise micelles, normal phase micelles such as oil-in-water micelles, reverse or inverse micelles, microemulsions, polyelectrolyte/surfactant complexes, organic matrices such as ordered polypeptides, multilamellar vesicles, unilamellar vesicles such as liposome, lyotropic liquid crystals, lipid-water (l-w) systems, lyotropic columnar liquid crystalline materials, lamellar structures, stacks of bilayers, and the like, and any combination thereof. As known to a skilled artisan, a lamella is a gill-shaped structure, such as fine sheets or layers of material held adjacent one another, with fluid in-between. A micelle is an aggregate of surfactant molecules dispersed in a liquid colloid. A typical micelle in aqueous solution forms an aggregate with the hydrophilic "head" regions in contact with surrounding solvent, sequestering the hydrophobic tail regions in the micelle center. This type of micelle is known as a normal phase micelle (oil-in-water micelle). Inverse micelles have the head groups at the center with the tails extending out (water-in-oil micelle). Micelles are approximately spherical in shape. Other phases, including shapes such as ellipsoids, cylinders, and bilayers, are also possible. The shape and size of a micelle is a function of the molecular geometry of its surfactant molecules and solution conditions, such as surfactant concentration, temperature, pH, and ionic strength. As known to a skilled artisan, a lipid bilayer or bilayer lipid membrane (BLM) is a membrane composed of lipid molecules (usually phospholipids). Any suitable polymorphisms are contemplated within the scope of the invention with respect to the behavior of lipids that influences their long-range order, i.e. how they aggregate. The polymorphism can be in the form of spheres of lipid molecules (micelles), pairs of layers that face one another (lamellar phase, such as a lipid bilayer), a tubular arrangement (hexagonal), or various cubic phases (Fd3m, Im3m, Ia3m, Pn3m, and Pm3m). More complicated aggregations may be rhombohedral, tetragonal and orthorhombic phases.

In a specific embodiment, the self-organized medium comprises a system of surfactant in water or an aqueous solution, such as $Cd(NO_3)_2$ solution. Such system may comprise a lyotropic structure, or a combination of two or more different lyotropic structures, such as a lamellar phase. The invention may use any suitable surfactant or mixture of surfactants, for example, a nonionic surfactant such as Poly(ethylene glycol)-block-poly(propylene glycol)-block-poly(ethylene glycol), including Synperonic (A7) commercially available from Croda International PLC.

Figure 2:
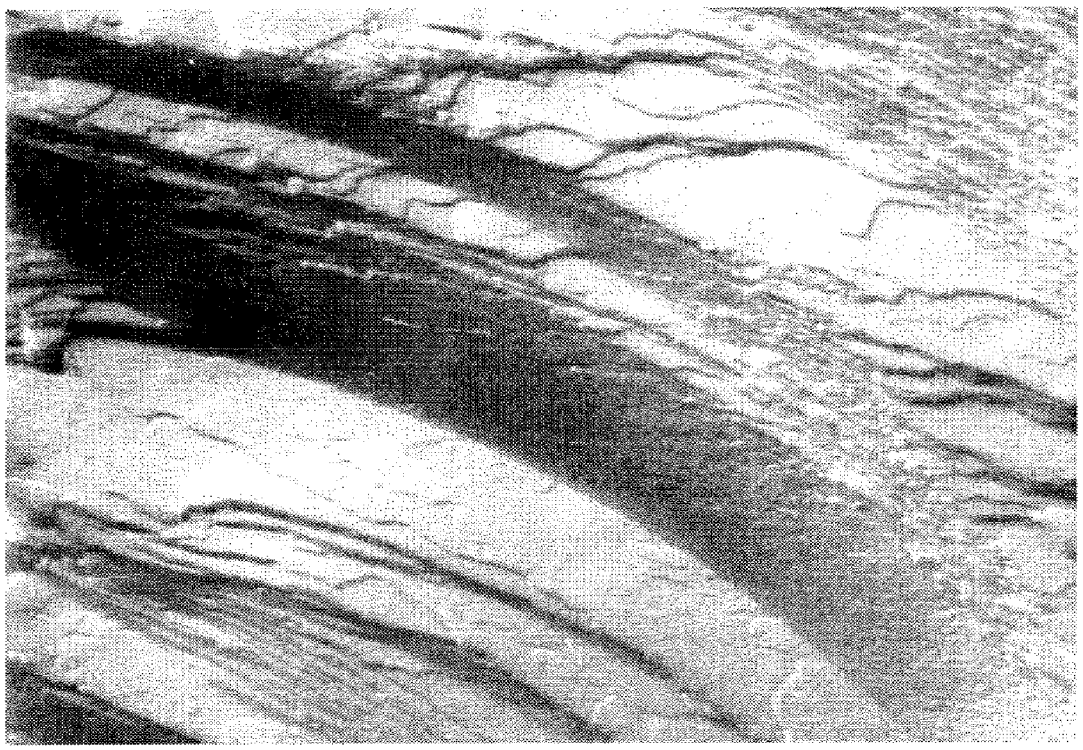
FIG. 2 shows the TEM (Transmission Electron Microscopy) picture of a self-organized medium such as a regular multilamellar arrangement typically observed in a Synperonic(A7)-water system with 50 to 85 wt % of surfactant concentration.
Figure 3:
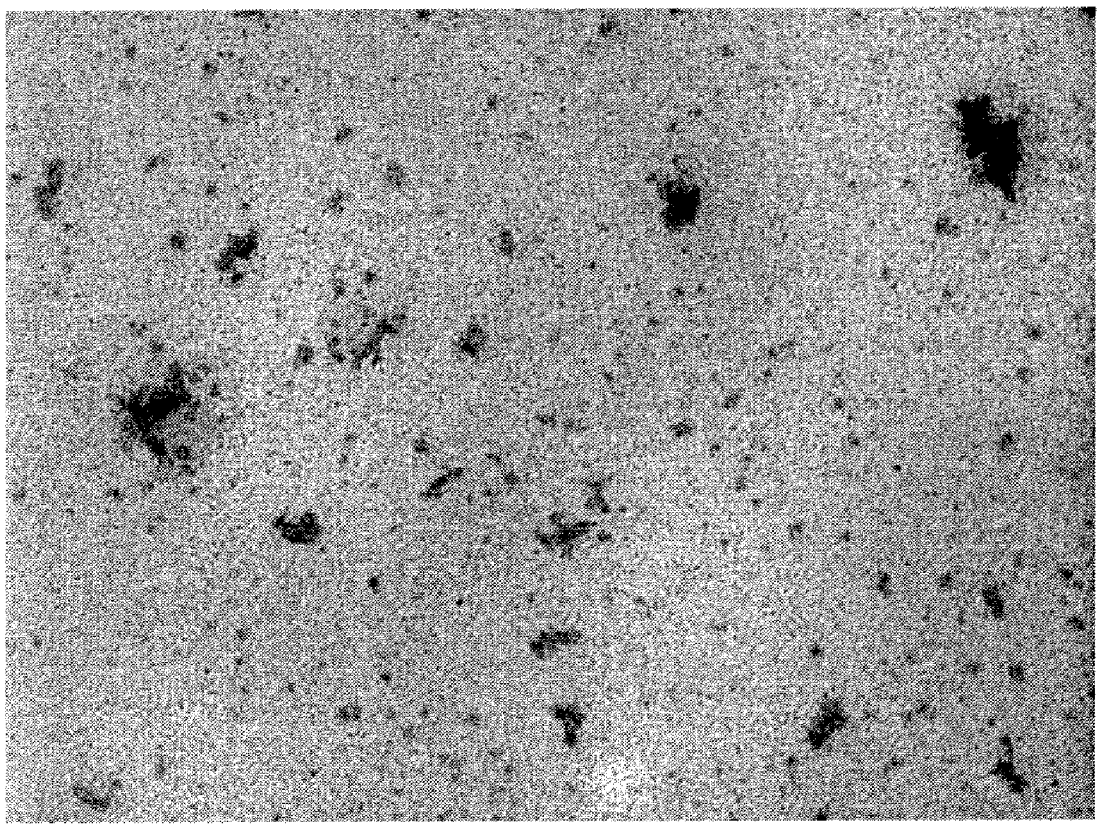
FIG. 3 shows the formation of CdS nanoparticles in a self-organized medium comprising a Synperonic(A7) (80 w %)-aqueous $Cd(NO_3)_2$ system dispersed with at least part of the particle-forming reactants.

A multilamellar system may be formed using the most common nonionic surfactant "Synperonic(A7)", which is the main component of several household detergents. This surfactant consists of alkyl chains with different lengths and a number of ethylene groups. By dispersing this surfactant in water, different lyotropic structures can be formed. At 20° C., the lamellar phase (with structure extending up to several μm-s) exists in the concentration range of from about 50 wt % up to about 85 wt %. This particular structure is of special interest in the cosmetic industry because it mimics the behavior of the barrier function of skin. FIG. 2 shows the TEM picture of a regular multilamellar arrangement typically observed in a Synperonic(A7)-water system with 50 to 85 wt % of surfactant concentration range. When a solution of any bivalent metal ions, for example a $Cd(NO_3)_2$ solution, instead of pure water is used to prepare an 80 wt % Synperonic(A7)-water system, a severe destruction of the lamellar arrangement occurs. However, after addition of a reagent, for example $(NH_4)_2S$ or $(NH_4)_xS$, to the system, the reconstruction of a well ordered multilamellar structure is observed. This same phenomenon can be observed in multilamellar vesicles, and is due to the formation of spherical CdS nanoparticles as shown in FIG. 3. FIG. 3 shows the formation of CdS nanoparticles in a Synperonic(A7) (80 w %)-aqueous $Cd(NO_3)_2$ system.

Figure 4:
FIG. 4 shows a freeze-fracture morphology of a self-organized medium comprising a Synperonic(A7) (80 wt %)-water (20 wt %) system after 2 hours shear at 20° C.

According to A. Bóta, Gy. Fetter, *In situ shear investigation of the Synperonic(A7)-water system by small angle X-ray scattering and freeze-fracture*, Langmuir, 20 (2004) 3901-3905) on the effect of shear on the layer structure of the Synperonic(A7) system, the stacks of strictly oriented layers are strongly destroyed under shear and large domains of lamellae are dissected into elongated, significantly smaller domains as can be seen in FIG. 4. In addition, a change in the layer spacing can also be detected, indicating significant influence of the shear on the nanostructure.

In some embodiments of the invention, the self-organized medium and the multilamellar system, taking into account the findings of A. Bota's reference as described above, were utilized to affect, for example, the nanostructure of the CdS nanoparticles, in an intensively stirred Synperonic(A7) system during the entire synthesis.

In various embodiments of the invention, the particles having a controllable anisotropic property comprise nanoparticles such as semiconducting nanoparticles. The particles may be selected from a bivalent salt or a mixture of two or more bivalent salts. Examples of bivalent salts that may suitable for use in the invention include, but are not limited to, CdS, PbS, CdSe, and any combination thereof.

Although there are no specific limitations on the anisotropic property possessed by the particles according to the invention, in various embodiments, the anisotropic property is related to anisotropic shape. For example, the anisotropic property may be expressed as the slenderness ratio (length/diameter) of particles such as nanorods. The particles comprise nanorods such as CdS nanorods with an average length less than about 80 nm and a diameter of from about 2 to about 10 nm. In some embodiments, the particles comprise nanorods such as CdS nanorods with an average length less than about 50 nm and a diameter of from about 2 to about 10 nm. In other embodiments, the average length is about 70±10 nm, and the width is about 7±1 nm (the aspect ratio=10±1).

To prepare particles such as CdS nanorods, the particle-forming reactants may comprise a bivalent metal ion such as $Cd^{2+}$ in a solution such as $Cd(NO_3)_2$ solution, and an inorganic anion such as $S^{2-}$ in a solution such as aqueous $(NH_4)_2S$ solution. Nanoparticles comprising sulfide or similar bivalent salts (e.g. PbS, CdSe) can be prepared in a similar manner using appropriate reagents.

Any shearing measures, and combinations thereof, may be used in the invention to provide the shear condition. For example, the particle-forming reaction may be conducted with a stirrer in the reaction system, and the rotation speed (in the unit of rpm) of the stirrer may be used to control the anisotropic property, such as anisotropic shape of the particles e.g. nanorods. The particle-forming reaction may be conducted within a flow-reactor, and the flow rate of the flow-reactor can be used to, at least partially, control the anisotropic property, such as anisotropic shape of the particles. A rotating plate or disk may also be used to apply the shear condition to the reaction system on the surface of the plate or disk. In numerous embodiments, the method of the invention is done under shear assuring, for example, the anisotropic shape of nanoproducts.

In embodiments, the present invention provides a less expensive, easy and controllable synthesis of nanoparticles from bivalent salts, for example from Cadmium Sulfide or similar bivalent salts (e.g. PbS, CdSe), wherein the resulting nanoparticles exhibit anisotropic shape. In one embodiment of the invention, these particles are rod-shaped particles having an average length of less than 50 nm and a diameter in the range of 2-10 nm.

In certain embodiments, the invention provides a method for the synthesis of bivalent salts in a surfactant-water system which contains an industrial grade nonionic surfactant (e.g. Synperonic(A7) or similar product) under shear to change the ratio of anisotropy.

In an embodiment of the invention, the particles formed are in the shape of nanorods and are prepared in a self-organized medium such as surfactant-water system under stirring, wherein the rate of stirring and the concentration of the reactants provide a simple way to vary the ratio of slenderness (length/diameter).

The present invention may be used in a wide range of industrial applications. One such application relates to the production of semiconductor nanoparticles that find application as quantum dots in a liquid crystal. A quantum dot is a semiconductor whose excitons are confined in all three spatial dimensions. As a result, the quantum dots have properties that are between those of bulk semiconductors and those of discrete molecules. As known to a skilled artisan, an exciton is a bound state of an electron and an electron hole in an insulator or semiconductor, and it can provide a means to transport energy without transporting net charge.

The particles of the invention may be used in various devices such as nonlinear optics, optoelectronic devices, solar cells, photocatalysis devices, photodegradation devices, nanolasers, computing devices, photoluminescence (PL) devices, electroluminescence (EL) devices, $H_2$ generators, liquid crystal displays, one-dimensional semiconductor nanostructures, chromogenic smart devices, optical switches, filters, integrated photonic devices, power conserving LCD devices, power-consuming reflective displays, backlit displays, cell phone displays, intensity-controlled switchable windows, traffic lights using reflective liquid crystal panels, spatial light modulators, and the like, and any combination thereof.

For example, semiconductor nanowires and rods exhibit unique thermal, electric, optical and mechanical properties, which have great potential applications, including their use in novel solar cell architectures, nanolasers, computational technology, and biological sciences and technologies. For example, it is known that CdS has vital optoelectronic applications for laser light-emitting diodes and optical devices based on nonlinear properties. CdS also exhibits photoluminescent (PL) and electroluminescent (EL) properties, and exhibit remarkable size-dependent optical properties, the combination of which has attracted a great deal of attention in recent years for both fundamental research and technical applications. CdS also has been utilized for $H_2$ production, in which the essential steps of the reaction include the separation of electrons and holes by absorption of light by CdS and the transfer of electrons to its conduction band.

The invention may be used in applications of nanorods combined with liquid crystals. A nanocomposite device, which consists of liquid crystals and semiconductor nanorods, exhibits a very unique and useful behavior in that the polarization of the emission from semiconductor nanorods can be controlled by an external bias. A large magnitude of polarization anisotropy such as 0.72 can be quantitatively interpreted in terms of the dielectric contrast difference between the semiconductor and liquid crystal. The invention is generally applicable to other nanomaterials, and it utilizes the mature liquid crystal display technology.

The invention is also useful for one-dimensional semiconductor nanostructures in smart optoelectronic applications, including optical switches, filters, integrated photonic devices and many other chromogenic smart devices. In addition to these utilities, the invention may also be used in power conserving LCD devices. For example, power-consuming reflective displays can incorporate CdS films allowing the device to automatically shut off when the ambient light is insufficient to use them. Cell phone displays, which are programmed to dim after a few seconds of inactivity in order to conserve power, can be made to brighten when brought out into the light and shut off or dim as soon as they are returned to a pocket or purse or placed on a desk with the display facing down. Other applications of the invention include intensity-controlled switchable windows, such as traffic lights using reflective liquid crystal panels that would be brighter on sunny days and dimmer at night or on cloudy days. Moreover, the invention can be used to simplify a spatial light modulator containing only an ITO, liquid crystal and a CdS layer.

EXAMPLES

Figure 5:
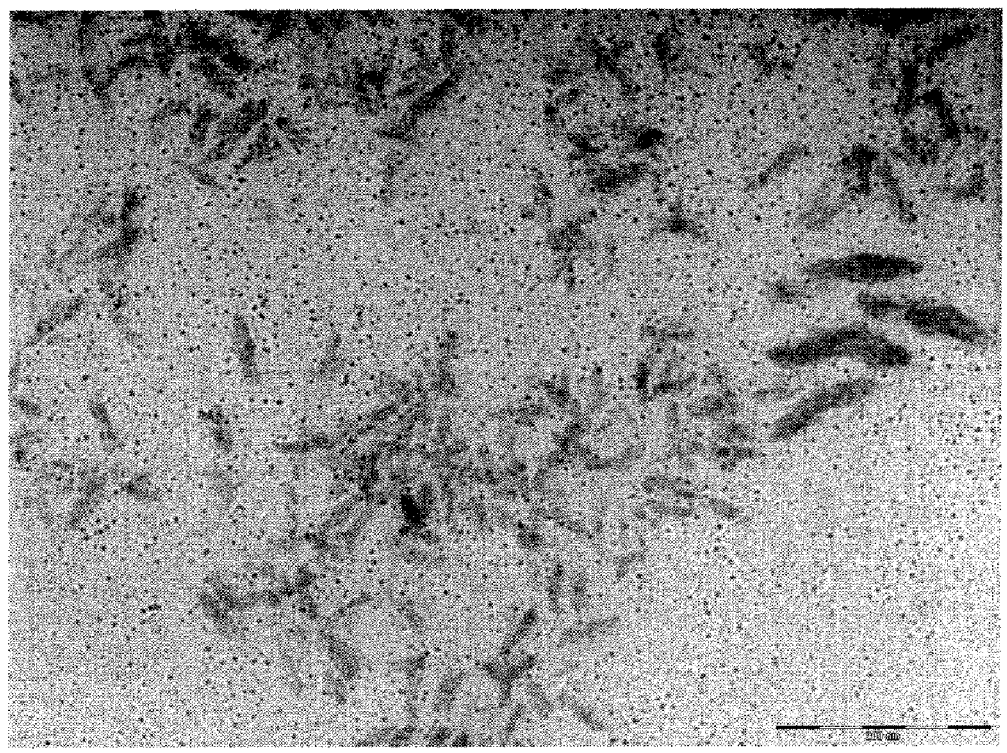
FIG. 5 demonstrates a typical TEM image of strongly anisotropic and elongated CdS nanoparticles (with average lengths less than 50 nm and diameters of 2-10 nm) formed in a self-organized medium dispersed with at least part of the particle-forming reactants, Synperonic(A7) (80 w %)-aqueous $Cd(NO_3)_2$ system (20 w %), under shear in an embodiment according to the invention.

In the following examples, nanoparticles according to the invention were prepared and tested. In a tank reactor (typically a vessel of 100 $cm^3$ used as a shaker), the Synperonic (A7) (80 w %)-aqueous $Cd(NO_3)_2$ system (20 w %) (volume of about 50 $cm^3$) was stirred by a small glass stirrer driven by an electric motor (shear rate was typically 20 $s^{-1}$). The concentration of $Cd(NO_3)_2$ was 10 mmol/$dm^3$. After about 2 minutes an aqueous $(NH_4)_2S$ solution was added to the stirred surfactant system drop by drop. The added volume of $(NH_4)_2S$ solution was 3 $cm^3$ assuring that the total ratio of surfactant in the system remained above 70 w/w %. If the surfactant concentration is smaller than 60%, no lamellar phase exists in the system. During the addition of $(NH_4)_2S$ reagent, the color of the system turned from transparent to jonquil. The whole process took about 5 minutes. After the end of the shear process the system was diluted by distilled water, and centrifuged using a small plastic vial at about 300 rpm. Finally, a small quantity of the sample was investigated by TEM. Typical TEM images, as seen from FIG. 5, demonstrate elongated CdS nanoparticles with average lengths less than 50 nm and diameters of 2-10 nm. FIG. 5 shows strongly anisotropic, elongated CdS nanoparticles formed in a Synperonic(A7) (80 w %)-aqueous $Cd(NO_3)_2$ system (20 w %) under shear.

Figure 6:
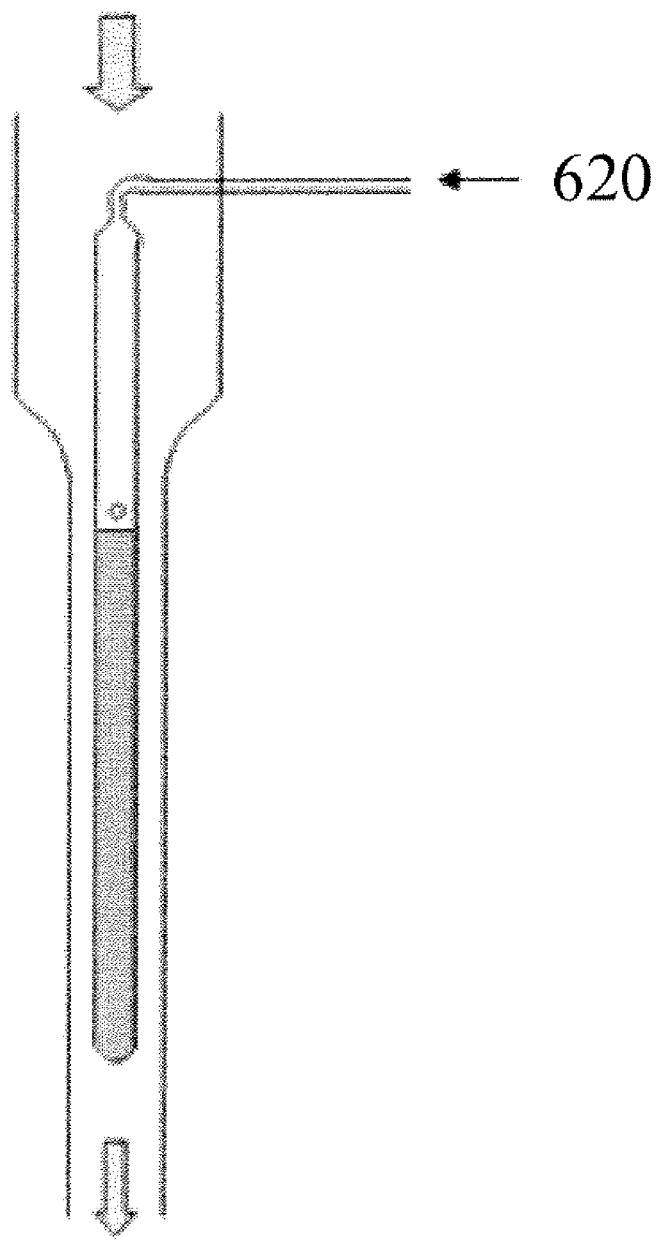
FIG. 6 schematically shows a flow-reactor used to enhance the continuity of CdS formation in an embodiment according to the invention.

To enhance the continuity of CdS formation, a device known to the skilled artisan as a flow-reactor was constructed as shown schematically in FIG. 6. The reactor includes two channels 610 and 620. The surfactant is injected through the outer channel 610 and the reagent is added through the inner channel 620. By changing the ratios of the area of the outer and inside channels, one can change the composition, and thus the shape of the CdS particles.

Example 1

Preparation of CdS Nanoparticles in a Tube Reactor at a Flow Rate of 0.5 $Cm^3$/Sec Synperonic A7 surfactant and 10 mM cadmium-nitrate solution were mixed together with a ratio of 70-30% and the mixture was poured to the top of the flow reactor. The flow rate of the surfactant solution was 0.5 $cm^3$/sec in the reactor. The flow rate of the 2% ammonium-sulfide reagent was set to a 20% fractional amount of the reagent. The manifestation of CdS particles in this procedure indicated individual nanoparticles with a diameter size of about 50-250 nm. In the nanoparticle bundle there were some particles for which the morphology was changed from that of a nanoparticle to that of a nanorod.

Example 2

Preparation of CdS Nanoparticles in a Tube Reactor at a Flow Rate of 1.5 $Cm^3$/Sec All of the properties for this example were the same as those reported for Example 1. The product of this Example 2 contains individual CdS nanoparticles with diameters of 15-60 nm, which is smaller than that found in the particles of Example 1, and a larger amount of regular nanorods with lengths of about 100-150 nm.

Example 3

Preparation of CdS Nanoparticles in a Tube Reactor at a Flow Rate of 1.5 $Cm^3$/Sec with a 50% Fractional Amount of Cadmium Ions Similar to Example 1, 70% Synperonic and 30% 10 mM cadmium-nitrate solution were mixed together and poured to the top of the reactor. The flow rate of the surfactant solution was 1.5 $cm^3$/sec, and the flow rate of the ammonium-sulphide reagent was set to 50% fractional amount of the cadmium ions. The manifestation of CdS nanocrystals indicates individual nanorods with lengths smaller than of the nanorods in Example 2.

Example 4

Making CdS Nanorods Under Stirring at 600 Rpm

5 $cm^3$ Synperonic A7 surfactant and cadmium-nitrate solution (70% surfactant –30% 10 mM cadmium-nitrate solution) were added into a glass. After heating up the solution to 60° C. 2% ammonium-sulphide was slowly added into the glass, under stirring. The reagent used as 20% of fractional amount. The stirrer was used at 600 rpm, which is twice of the speed used in Examples 1-3. In this procedure the product consists individual CdS nanorods with lengths of about 20-200 nm.

Example 5

Making CdS Nanorods Under Stirring at 60 Rpm

5 $cm^3$ Synpeonic A7 surfactant and cadmium-nitrate solution were added into a glass. The proportion of the surfactant to the cadmium-nitrate solution, and the heating temperature were the same as in Example 4. The 2% ammonium-sulphide was slowly added to the surfactant solution at relative slower stirring (60 rpm). The reagent used as 20% of fractional amount. The manifestation of the CdS nanocrystals in this procedure indicated regular and individual nanorods with length of 100-200 nm, which are larger and more uniform than in Example 4.

Example 6

UV-Vis Absorption

Figure 7:
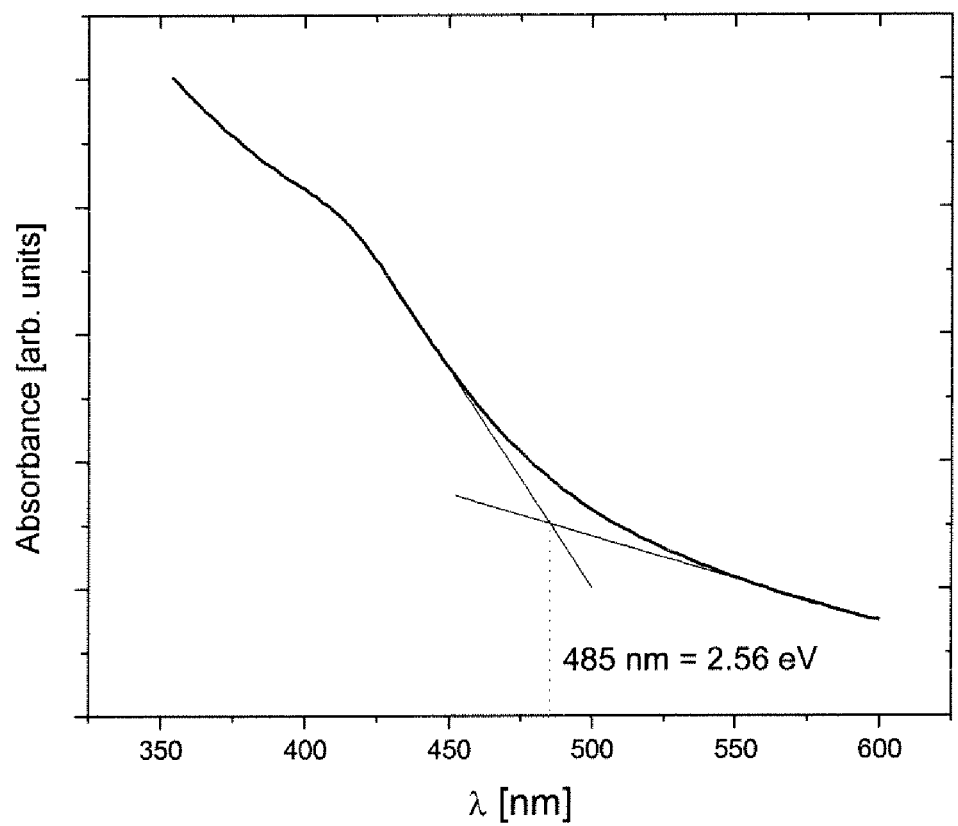
FIG. 7 shows a typical UV-Vis absorption spectrum of CdS nanorods used to characterize their electronic (semiconductor) property in an embodiment according to the invention.

TEM and UV-Vis absorption spectrums of the nanoparticles were studied, so as to characterize their electronic (semiconductor) behavior. FIG. 7 shows a typical absorption spectrum of the CdS nanorods. Cadmium-sulfide is a direct band gap semiconductor with a band gap of 2.4 eV in the bulk form. The band gap value obtained from the sample prepared with the Synperonic A7 system in a tank reactor under shear (the sample in example 1) was 2.56 eV based on the data in FIG. 7. (See P. E. Lippens and M. Lannoo, Phys. Rev. B 39, 10 935 (1989)). This value is larger than of the bulk value due to the quantum size effect. Using a tight-binding approximation for the size dependence of the band gap, the average radius of the particles is determined to be 5 nm, which is in agreement with the TEM results shown in FIG. 5.

Example 7

Making CdS Nanorods Under Spinning at 4000 Rpm

Figure 8:
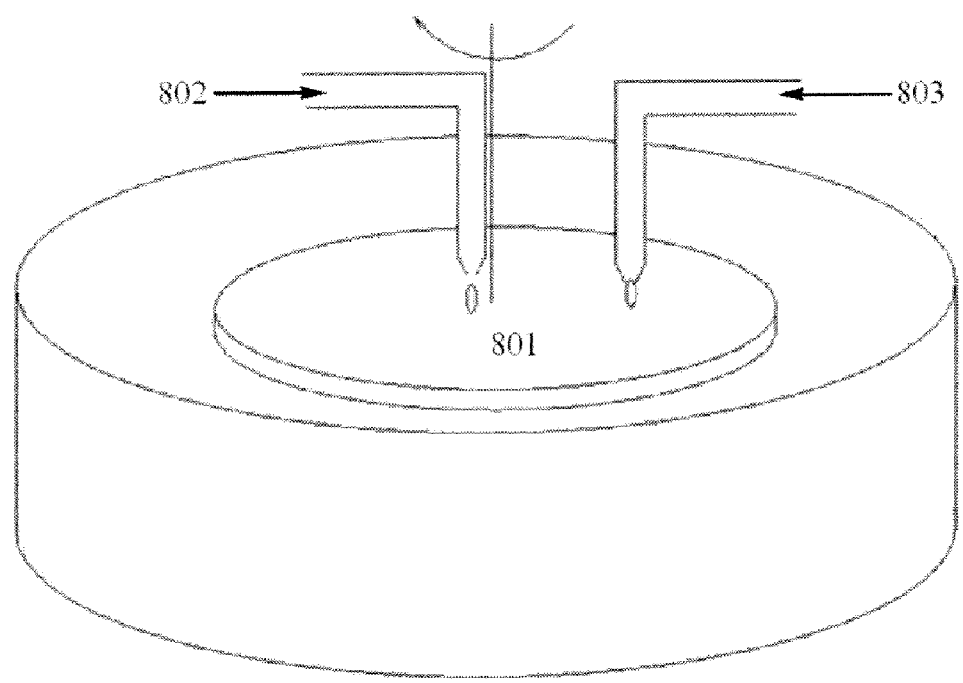
FIG. 8 schematically shows a device for making CdS nanorods in an embodiment of the invention.

In this Example, a device as shown in FIG. 8 was used to make CdS nanorods. With reference to FIG. 8, two channels 802 and 803 are used to dispense or drop the particle-forming reactants and the self-organized medium onto a rotating plate 801. The plate 801 was made of plexi or glass with a diameter of 20 cm. On the surface of plate 801, the particle-forming reaction can occur under a shear condition such as spinning/rotating of the plate 801.

Figure 9:
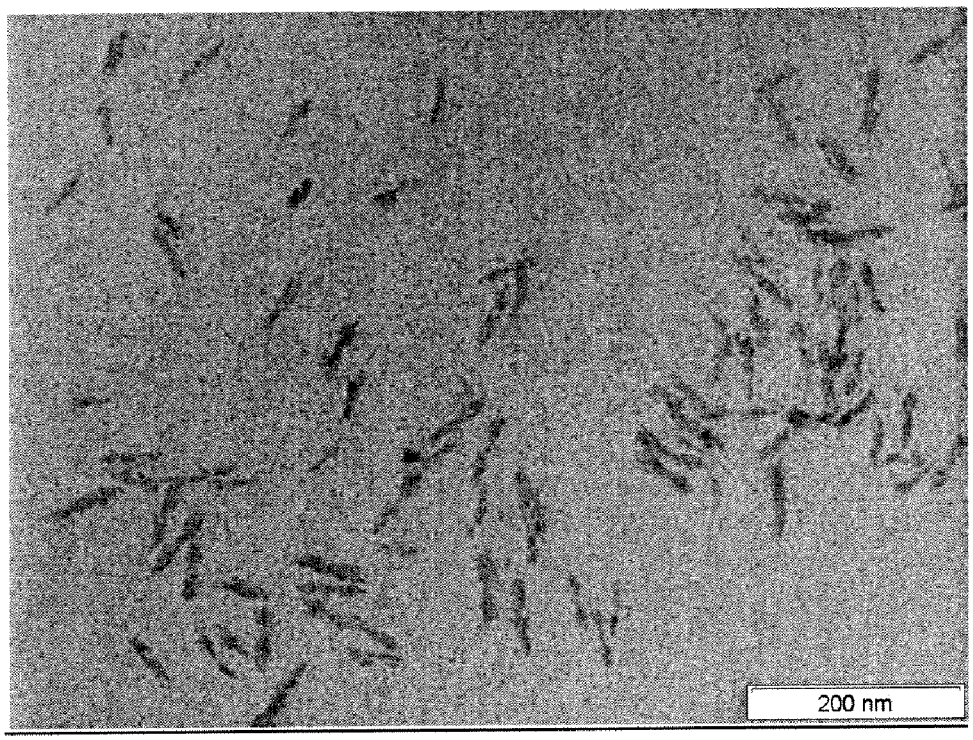
FIG. 9 shows the TEM image of needle-like CdS nanorods prepared according to an embodiment of the invention.

5 cm$^3$ Synperonic A7 surfactant-water system containing cadmium nitrate was dropped through channel 802 onto the surface of the plate 801 (rotating at 4000 rpm) near its center. Simultaneously, the 2% ammonium-sulphide solution was also dropped through channel 803 onto the film of the cadmium-nitrate/surfactant-water system at the radius of about 5 cm. The formation of the CdS nanoparticles occurred in the outer part of the rotating disc 801, as a green-yellowish color was observed only at the side of the disc. Extremely anisotropic and needle-shaped nanorods were formed in this Example, and their TEM image is shown in FIG. 9. It was estimated that the average length of these nanorods is about 70±10 nm, and the width is about 7±1 nm (the aspect ratio=10±1).

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of preparing nanoparticles having a controllable anisotropic property, comprising:
   (i) providing inorganic particle-forming reactants, selected from the group consisting of CdS, PbS, CdSe, and any combination thereof;
   (ii) dispersing at least part of the particle-forming reactants in a self-organized medium, and
   (iii) conducting a particle-forming reaction using the particle-forming reactants dispersed in the self-organized medium under shear condition to form the nanoparticles,
   wherein said anisotropic property of the nanoparticles is controlled at least partially by the shear condition.

2. The method according to claim 1, in which the self-organized medium comprises reaction compartments for the particle-forming reaction.

3. The method according to claim 1, in which the self-organized medium comprises micelles, normal phase micelles, reverse or inverse micelles, microemulsions, polyelectrolyte/surfactant complexes, organic matrixes, multilamellar vesicles, unilamellar vesicles, lyotropic liquid crystals, lipid-water (l-w) system, lyotropic columnar liquid crystalline materials, lamellar structures, stacks of bilayers, or any combination thereof.

4. The method according to claim 1, in which the self-organized medium comprises a system of a surfactant in water or an aqueous solution.

5. The method according to claim 4, in which the system comprises a lyotropic structure, or a combination of at least two different lyotropic structures.

6. The method according to claim 4, in which the system is in the lamellar phase.

7. The method according to claim 4, in which the surfactant comprises a nonionic surfactant.

8. The method according to claim 1, in which the nanoparticles having a controllable anisotropic property comprise semiconducting nanoparticles.

9. The method according to claim 1, in which the nanoparticles having a controllable anisotropic property comprise a bivalent salt.

10. The method according to claim 1, in which the anisotropic property is anisotropic shape.

11. The method according to claim 1, in which the anisotropic property comprises the ratio of slenderness (length/diameter).

12. The method according to claim 1, in which the nanoparticles having a controllable anisotropic property comprise nanorods with an average length less than about 80 nm and a diameter of from about 2 to about 10 nm.

13. The method according to claim 12, in which the nanorods are CdS nanorods.

14. The method according to claim 1, in which the particle-forming reactants comprise a bivalent metal ion in a solution and an inorganic anion in a solution.

15. The method according to claim 1, in which the particle-forming reaction is conducted within a flow-reactor.

16. The method according to claim 15, in which the flow rate of the flow-reactor reactor is used to control the anisotropic property.

17. The method according to claim 1, in which the particle-forming reaction is conducted with a stirrer.

18. The method according to claim 17, in which the rotation speed of the stirrer is used to control the anisotropic property.

19. The method according to claim 1, in which the nanoparticles are used as quantum dots in a liquid crystal.

20. A method of preparing a device including the step of using nanoparticles having a controllable anisotropic property, which comprises:
   (i) providing inorganic particle-forming reactants, selected from the group consisting of CdS, PbS, CdSe, and any combination thereof;
   (ii) dispersing at least part of the particle-forming reactants in a self-organized medium,
   (iii) conducting a particle-forming reaction using the particle-forming reactants dispersed in the self-organized medium under shear condition to form the nanoparticles, and (iv) including the nanoparticles in the device,
   wherein said anisotropic property of the particles is controlled at least partially by the shear condition.

21. The method according to claim 20, in which the device is selected from nonlinear optics, optoelectronic devices, solar cells, photocatalysis devices, photodegradation devices, nanolasers, computing devices, photoluminescence (PL) devices, electroluminescence (EL) devices, H.sub.2 generators, liquid crystal displays, one-dimensional semiconductor nanostructures, chromogenic smart devices, optical switches, filters, integrated photonic devices, power conserving LCD devices, power-consuming reflective displays, backlit displays, cell phone displays, intensity-controlled switchable windows, traffic lights using reflective liquid crystal panels, spatial light modulators, and any combination thereof.

* * * * *